United States Patent [19]

Wolfgang et al.

[11] Patent Number: 5,786,633
[45] Date of Patent: Jul. 28, 1998

[54] SEMICONDUCTOR MODULE HAVING HIGH INSULATING POWER AND HIGH THERMAL CONDUCTIVITY

[75] Inventors: Eckhard Wolfgang; Reinhold Kuhnert, both of Munich, Germany

[73] Assignee: Siemens Aktiengesellschaft, Munich, Germany

[21] Appl. No.: 8,734

[22] Filed: Jan. 25, 1993

[30] Foreign Application Priority Data

Jan. 23, 1992 [DE] Germany ............... 42 01 794.7

[51] Int. Cl.[6] ................................. H01L 23/36
[52] U.S. Cl. ................. 257/706; 257/707; 257/712; 257/713
[58] Field of Search ................. 257/712, 717, 257/701, 702, 706, 707, 713

[56] References Cited

U.S. PATENT DOCUMENTS 3,872,496  3/1975  Potter ........................... 257/720
5,031,029  7/1991  Acocella et al. ............... 257/712

OTHER PUBLICATIONS

"Main aspects in designing DCB substrates for automotive applications," Vebindrungstechnik in der Electronik. 5. Int. Vollopuim, Feb. 22, 1990, pp. 25–29.

*Primary Examiner*—Peter Toby Brown
*Attorney, Agent, or Firm*—Hill & Simpson

[57] ABSTRACT

A semiconductor module having a high dissipated power has an electrically insulating and thermally conducting layer of crystalline carbon provided between a semiconductor chip and a heat elimination element, whereby the semiconductor chip, the insulating layer and the heat elimination element are connected via an intermediate layer and via connecting layers of silver by pressure sintering. For low-voltage applications, a layer of amorphous carbon can alternatively be employed instead of the layer of crystalline carbon. Extremely low heat transmission resistance between the semiconductor chip and the heat elimination element is provided.

9 Claims, 3 Drawing Sheets

5,786,633

SEMICONDUCTOR MODULE HAVING HIGH INSULATING POWER AND HIGH THERMAL CONDUCTIVITY

BACKGROUND OF THE INVENTION

1. Field of the Invention

The invention is directed generally to a semiconductor module whereby an electrically insulating and thermally conducting layer is provided between a semiconductor chip and a heat elimination means.

2. Description of the Related Art

Semiconductor modules of the foregoing type that comprise an electrically insulating and heat-conducting layer between a semiconductor chip and a heat elimination means are known, for example, from papers presented at the 5th Colloquium "Verbindungstechnik in der Elektronik", Fellbach, 20 through 22 Feb. 1990, pages 25–29. The insulating layer thereby involves, for example, an $Al_2O_3$ layer onto which intermediate layers of copper are applied on both sides (by direct copper bonding). The semiconductor chip is connected via a solder layer to the one intermediate layer and the heat elimination means is connected via a further solder layer or a glue layer to the other intermediate layer.

SUMMARY OF THE INVENTION

An object of the present invention is to provide a semiconductor module that, given comparable insulating power between the semiconductor chip and the heat elimination means, has significantly lower thermal resistance between the semiconductor chip and the heat elimination means than the known semiconductor modules.

This and other objects and advantages of the invention are inventively achieved by a semiconductor module having an electrically insulating and thermally conducting layer composed of crystalline carbon provided between a semiconductor chip and a heat elimination means, and whereby a mechanical connection between the semiconductor chip, the insulating layer and the heat elimination means is present via connecting layers composed of silver and at least one intermediate layer.

Alternately, the semiconductor module has an electrically insulating and thermally conducting layer provided between a semiconductor chip and a heat elimination means, a mechanical connection between the semiconductor chip, the insulating layer and the heat elimination means being by connecting layers and at least one intermediate layer, the electrically insulating and thermally conducting layer being composed of amorphous carbon and the connecting layers being composed of silver insofar as the semiconductor module is only supplied with low voltage.

In a preferred development, the semiconductor module has only one intermediate layer between the semiconductor chip and the insulating layer, the one intermediate layer being mechanically connected both to the semiconductor chip as well as to the insulating layer by the connecting layers. The mechanical connection of the semiconductor chip, of the intermediate layer, of the insulating layer, and of the heat elimination means can be produced by pressure sintering.

In one embodiment, the intermediate layer is composed of copper that, in sequence, has a coating of nickel and a coating of silver, while in another embodiment, the coating on the copper intermediate layer is, in sequence, respective coatings of titanium, platinum and gold. The heat elimination means of a preferred embodiment is composed of a metallic bottom plate of the semiconductor module, the bottom plate having a sinterable end face region. In another embodiment, the heat elimination means is composed of a cooling member and the cooling member has a sinterable end face region. The insulating layer of crystalline carbon is deposited directly on an end face region of the cooling member.

Advantages are achieved by the electrically insulating and thermally conducting layer being composed of polycrystalline carbon. Still further advantages are achieved when the electrically insulating and thermally conducting layer is instead composed of monocrystalline carbon.

BRIEF DESCRIPTION OF THE DRAWINGS

The invention shall be set forth in greater detail below with reference to the drawings.

DETAILED DESCRIPTION OF THE PREFERRED EMBODIMENTS

Figure 1:
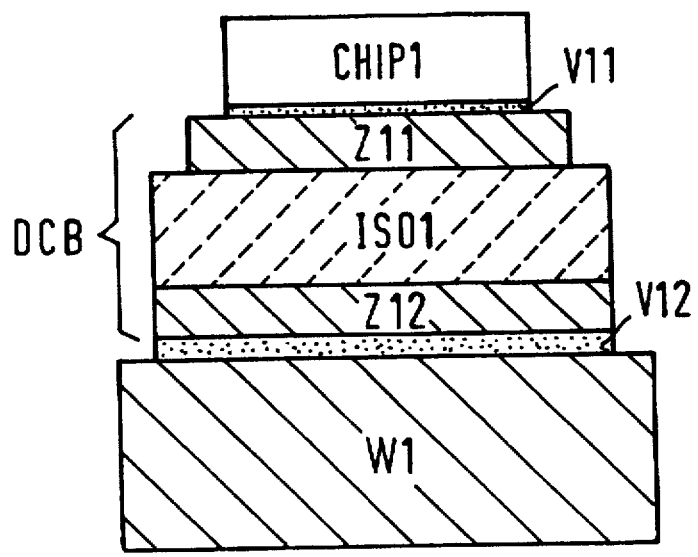
FIG. 1 is a cross-sectional view of a known semiconductor module.

FIG. 1 shows a cross-sectional view through a known semiconductor module, in which a DCB (direct copper bonded) substrate DCB that is composed of an insulator layer IS01 onto both sides of which intermediate layers Z11 and Z12 of copper are applied is situated between a semiconductor chip CHIP1 and a heat elimination means W1. The heat elimination means W1 forms a bottom plate of the semiconductor module that, for example, is a 3 mm thick copper plate. The semiconductor chip CHIP1 is mechanically joined to an intermediate layer Z12 via a connecting layer V11 of solder and the intermediate layer Z12 is, in turn, mechanically connected to the heat elimination means W1 via a connecting layer V12 of solder or glue.

As one proceeds through a typical configuration of a solder connecting layer V11 having a thickness of 50 μm and a solder or glue connecting layer V12 having a thickness of approximately 100 μm, intermediate layers Z11 and Z22 each having a respective thickness of 300 μm and an insulating layer IS01 of a standard ceramic such as $Al_2O_3$ or, respectively, AlN having a layer thickness of approximately 600 μm, then the one-dimensional thermal resistance $R_{th}$ is approximately equal to 0.35 K cm$^2$/W, given a thermal conductivity of copper k=3.8 W/cm K and a thermal conductivity of k=0.3 W/cm K for the $Al_2O_3$ ceramic layer together with the thermal resistance of the bottom plate. The lateral dimensions of the layers enlarge toward the heat elimination means, so that a thermal dissipation that is equivalent to a reduction of the effective thermal resistance additionally derives.

Figure 2:
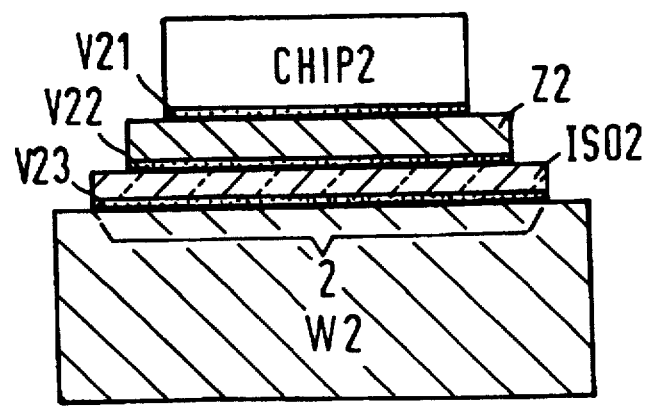
FIG. 2 is a cross-sectional view through a semiconductor module according to the principles of the invention, whereby the bottom plate of the power semiconductor component serves as a heat elimination means.

A critical fundamental idea behind the present invention is that the thermal resistance insulating layer and of the connecting layers is simultaneously optimized. A first embodiment of a semiconductor module of the invention is shown in FIG. 2 and comprises an intermediate layer Z2 and an insulating layer ISO2 of crystalline carbon (i.e. diamond) between a semiconductor chip CHIP2 and a heat elimination means W2 which is in the form of a bottom plate. The insulating layer ISO2 is electrically insulating and thermally conducting. The layer of crystalline carbon which forms the insulating layer ISO2 may be either a polycrystalline or a monocrystalline carbon layer. The monocrystalline carbon layer, for example, can be produced by designational placing of crystallization nuclei and has better thermal conductivity than a polycrystalline carbon layer due to the lack of grain boundaries. An embodiment having an amorphous carbon layer as the insulating layer may be provided as well.

The intermediate layer Z2, for example, is composed of copper. A connecting layer V21 of silver is situated between the semiconductor chip CHIP2 and the intermediate layer Z2 and serves the purpose of providing thermal contact between the vertically arranged components. The intermediate layer Z2 is likewise mechanically connected by a silver connecting layer V22 to the insulator layer ISO2 and the insulator layer ISO2 is in turn again mechanically connected via a silver connecting layer V23 to an end face region 2 of the heat elimination means W2. During the manufacturing of the semiconductor module of the invention, a silver paste, for example, is applied, for instance by silkscreening, onto the intermediate layer Z2 in the region of the contacting surfaces and onto the end face region 2 of the heat elimination means W2.

The mechanical connection between the semiconductor chip CHIP2 and the heat elimination means W2 is subsequently effected through the use of a method of low-temperature joining technology referred to as pressure sintering, that is already known. The layer thickness of the silver paste applied to the connected surfaces is in the range of approximately 10 through 100 μm and the silver paste is composed of silver powder having lamina-shaped powder particles that are suspended in cyclohexanol as a solvent. The sintering temperature amounts to, for example, 230° C. and a pressure of at least 900 N/cm² is exerted on the entire arrangement in the vertical direction during a sintering time of approximately 1 minute. The sintering temperature may lie in a range that has a lower limit of approximately 150° C. and an upper limit of approximately 250° C. It should be pointed out that an adequate joining of the layers is achieved after sintering for a few seconds, so that the sintering time may be decreased if desired. It is also pointed out that the pressure can be increased to between 1 through 2 t/cm².

Figure 5:
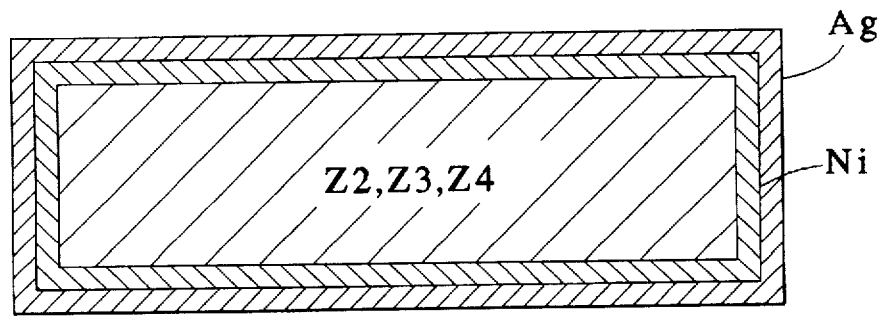
FIG. 5 is a cross-sectional view of an intermediate layer showing coatings thereon.
Figure 6:
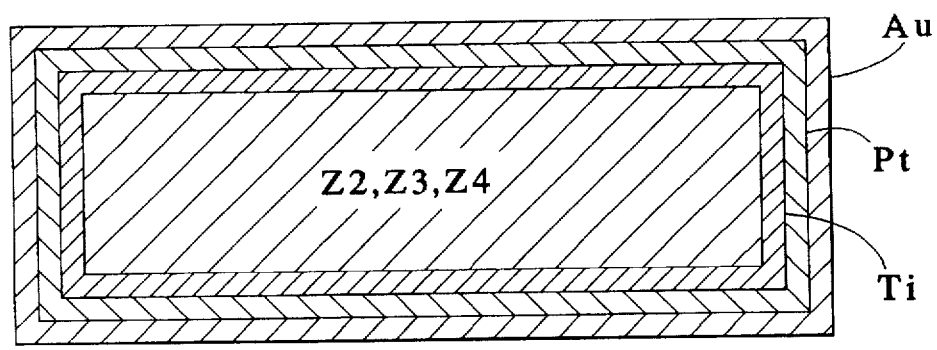
FIG. 6 is a cross-sectional view of an intermediate layer showing the coatings of another embodiment.

To create sinterable surfaces on the semiconductor chip CHIP2 and on the intermediate layer Z2, for example, a layer sequence of titanium, platinum and gold is either vapor-deposited or sputtered on the respective surfaces as shown in FIG. 6, and the end face region 2 of the heat elimination means W2 is, for example, first nickel-plated and then silver-plated like the intermediate layer shown in FIG. 5 or, as in the case of the intermediate layer, is provided with a sequence of titanium, platinum and gold layers.

When, for example, the thicknesses of the connecting layers V21, V22, and V23 are each respectively selected as 10 μm, the thickness of the intermediate layer Z2 is selected as 300 μm, the thickness of the crystalline carbon layer ISO2 is selected equal to approximately 100 μm and the thickness of the bottom plate, as shown in FIG. 1, is selected as 3 mm, then a one-dimensional thermal resistance $R_{th}$ of approximately 0.1 K cm²/W derives given a thermal conductivity of, for example, polycrystalline carbon (i.e. diamond) of k=12 W cm K and of the connecting layers of silver at k=4 W/cm K together with the thermal resistance of the bottom plate. The heat transmission resistance is lower by approximately a factor of 3 given a comparable insulating power when compared to the prior art.

Figure 3:
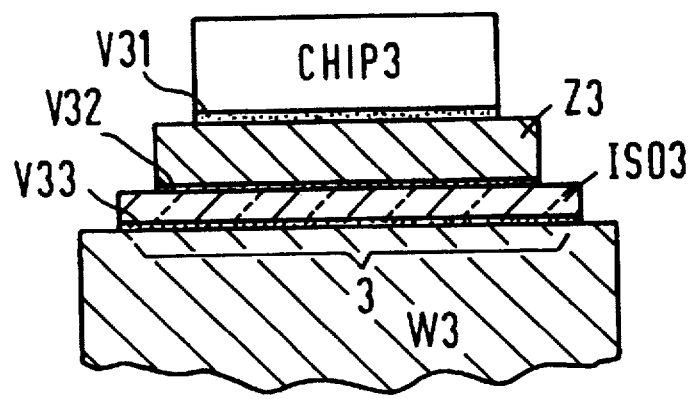
FIG. 3 is a cross-sectional view through a semiconductor module according to the invention, whereby the heat elimination means is composed of a cooling member.

A second embodiment of the semiconductor module of the invention as shown in FIG. 3 is composed of a semiconductor chip CHIP3, connecting layers V31, V32, and V33, an intermediate layer Z3, an insulator layer ISO3 of crystalline carbon and of a heat elimination means W3, whereby the structure of the semiconductor module of FIG. 2 is identical to the structure of the semiconductor module of FIG. 3 except for the heat elimination means W3. Instead of the heat elimination means W2 in the form of a bottom plate, the heat elimination means W3 is a cooling member or heat sink that, for example, is composed of aluminum or copper and which has an end face region 3 with a sinterable surface. A thermal resistance $R_{th}$ which is equal to approximately 0.02 K/W cm² between the semiconductor chip CHIP3 and an end face region 3 of the cooling member, given a one-dimensional view, is thereby achieved with the layer thicknesses recited above by way of example.

Figure 4:
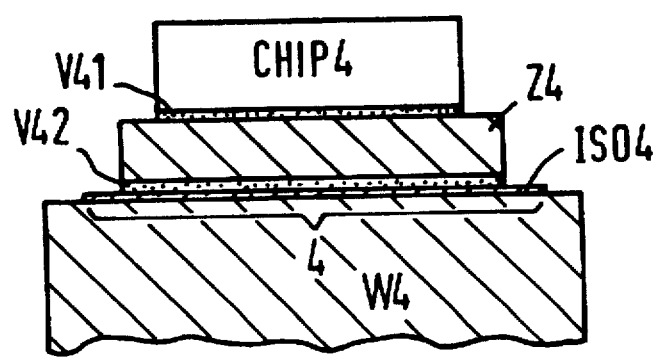
FIG. 4 is a cross-sectional view through a semiconductor module of the invention of FIG. 3, whereby the insulating layer is directly applied onto the cooling member.

FIG. 4 shows a third exemplary embodiment of the semiconductor module of the present invention wherein connecting layers V41 and V42, an intermediate layer Z4 and an insulating layer ISO4 of crystalline carbon are situated between a semiconductor chip CHIP4 and a heat elimination means W4, which is in the form of a cooling member or heat sink. The insulator layer ISO4 is grown on an end face region 4 of the cooling member. A connecting layer V42 connects the insulating layer ISO4 to the intermediate layer Z4 and a connecting layer V41 connects the semiconductor chip CHIP4 to the intermediate layer Z4.

The embodiment shown in FIG. 4 differs from the embodiment shown in FIG. 3 only in that the insulator layer ISO4 is grown directly on the cooling member W4 and no connecting layer is provided between the insulating layer ISO4 and the heat elimination means W4. By eliminating a connecting layer and due to the possibility that the insulating layer ISO4 may be thinner, for example the insulating layer ISO4 may be a polycrystalline carbon layer having a thickness of 30 μm that can be manipulated better due to direct growth of the layer ISO4 on the cooling member W4, a further reduction of the thermal resistance is possible. Before growing the insulator layer ISO4 on the end face region 4 of the cooling member W4, the end face region 4 can be provided with a layer of, for example, molybdenum or aluminum. The heat transmission resistance $R_{th}$ between the semiconductor chip CHIP4 and the end face region 4 of the cooling member amounts to approximately 0.01 K/W cm² insofar as the layer thicknesses are selected to be approximately equal to those set out in association with FIG. 2.

FIGS. 5 and 6 show the intermediate layers Z2, Z3, or Z4 with, in FIG. 5 coatings of nickel and silver layers and, in FIG. 6, coatings of titanium, platinum and gold layers.

For applications wherein only voltages below 100 V occur, an amorphous carbon layer, referred to as an a-C:H layer, having a thickness of less than approximately 1 μm may be used as the insulating layer; such layers, however, have a lower electrical insulating power and a lower thermal conductivity than crystalline carbon layers.

The semiconductor modules according to the present invention find particular utility in the field of power semiconductors such as, for example, thyristors, in other semiconductor components wherein high dissipated powers occur, such as, for example laser or high-power light emitting diodes (LEDs), as well as in microwave components. The teachings of the present invention are also applicable, however, in ICs (integrated circuits) which require a good heat elimination.

The intermediate layer of copper which serves to provide thermal contact between the layer may be foregone as warranted.

Although other modifications and changes may be suggested by those skilled in the art, it is the intention of the inventors to embody within the patent warranted hereon all changes and modifications as reasonably and properly come within the scope of their contribution to the art.

We claim:

1. A semiconductor module, comprising:

a semiconductor chip;

means affixed to said semiconductor chip for eliminating heat from said semiconductor chip;

an electrically insulating and thermally conducting layer of crystalline carbon between said semiconductor chip and said means for eliminating heat;

at least one intermediate layer between said semiconductor chip and said means for eliminating heat; and connecting layers of silver between said semiconductor chip and said means for eliminating heat;

wherein said intermediate layer is composed essentially of copper and is coated with nickel and silver.

2. A semiconductor module as claimed in claim 1, wherein said electrically insulating and thermally conducting layer is of polycrystalline carbon.

3. A semiconductor module as claimed in claim 1, wherein said electrically insulating and thermally conducting layer is of monocrystalline carbon.

4. A semiconductor module, comprising:

a semiconductor chip;

means affixed to said semiconductor chip for eliminating heat from said semiconductor chip;

an electrically insulating and thermally conducting layer of crystalline carbon between said semiconductor chip and said means for eliminating heat;

at least one intermediate layer between said semiconductor chip and said means for eliminating heat; and connecting layers of silver between said semiconductor chip and said means for eliminating heat; wherein said intermediate layer is composed essentially of copper and is coated with titanium, platinum and gold layers.

5. A semiconductor module as claimed in claim 4, wherein said electrically insulating and thermally conducting layer is of polycrystalline carbon.

6. A semiconductor module as claimed in claim 4, wherein said electrically insulating and thermally conducting layer is of monocrystalline carbon.

7. A semiconductor module, comprising:

semiconductor chip;

means affixed to said semiconductor chip for eliminating heat from said semiconductor chip;

an electrically insulating and thermally conducting layer of crystalline carbon between said semiconductor chip and said means for eliminating heat;

at least one intermediate layer between said semiconductor chip and said means for eliminating heat; and connecting layers of silver between said semiconductor chip and said means for eliminating heat;

wherein said means for eliminating heat comprises a cooling member having an end face region, said end face region of said cooling member being mounted directly on said electrically insulating and thermally conducting layer.

8. A semiconductor module as claimed in claim 7, wherein said electrically insulating and thermally conducting layer is of polycrystalline carbon.

9. A semiconductor module as claimed in claim 7, wherein said electrically insulating and thermally conducting layer is of monocrystalline carbon.

* * * * *